(12) United States Patent
Tufty et al.

(10) Patent No.: US 10,271,456 B2
(45) Date of Patent: Apr. 23, 2019

(54) ENCLOSURE FOR LIQUID SUBMERSION COOLED ELECTRONICS

(71) Applicant: LiquidCool Solutions, Inc., Rochester, MA (US)

(72) Inventors: Rick Tufty, Rochester, MN (US); Steve Shafer, Rochester, MN (US)

(73) Assignee: LIQUIDCOOL SOLUTIONS, INC., Rochester, MN (US)

( * ) Notice: Subject to any disclaimer, the term of this patent is extended or adjusted under 35 U.S.C. 154(b) by 34 days.

(21) Appl. No.: 14/867,541

(22) Filed: Sep. 28, 2015

(65) Prior Publication Data

US 2016/0095253 A1    Mar. 31, 2016

Related U.S. Application Data

(60) Provisional application No. 62/056,150, filed on Sep. 26, 2014.

(51) Int. Cl.
*H05K 7/20* (2006.01)
*H05K 5/00* (2006.01)
*H05K 5/06* (2006.01)

(52) U.S. Cl.
CPC ....... *H05K 7/20236* (2013.01); *H05K 5/0008* (2013.01); *H05K 5/06* (2013.01); *H05K 7/20263* (2013.01)

(58) Field of Classification Search
CPC ..... H05K 7/20236; H05K 5/0008; H05K 5/00
USPC ................. 361/699, 714; 257/E23.098, 714; 165/159, 80.4, 104.33
See application file for complete search history.

(56) References Cited

U.S. PATENT DOCUMENTS

| | | | |
|---|---|---|---|
| 4,656,559 A * | 4/1987 | Fathi | H05K 7/20409 361/721 |
| 6,144,556 A * | 11/2000 | Lanclos | H05K 7/20145 361/695 |
| 7,403,392 B2 | 7/2008 | Attlesey et al. | |
| 7,905,106 B2 | 3/2011 | Attlesey | |
| 8,089,765 B2 | 1/2012 | Attlesey | |
| 8,157,269 B2 * | 4/2012 | Rueger | F16J 15/127 277/594 |

(Continued)

FOREIGN PATENT DOCUMENTS

DE    202004003644    5/2004

OTHER PUBLICATIONS

International Search Report for International Application No. PCT/US2015/052149, dated Jan. 13, 2016 (3 pages).

(Continued)

*Primary Examiner* — Mandeep S Buttar
(74) *Attorney, Agent, or Firm* — Hamre, Schumann, Mueller & Larson, P.C.

(57) ABSTRACT

An enclosure for an electronic system that is configured to act as a heat exchanger to remove heat from a cooling liquid that is circulated through the electronic system for cooling the electronic components thereof which are submerged in the cooling liquid in direct contact therewith. The enclosure uses an arrangement of a combination of external fins on one or more walls and fluid passages formed in one or more of the walls through which the cooling liquid is circulated for cooling. The fluid passages and the external fins are preferably formed on the same wall. The fins and the fluid passages can be formed on any number of walls of the enclosure.

11 Claims, 13 Drawing Sheets

(56) References Cited

U.S. PATENT DOCUMENTS

| | | | |
|---|---|---|---|
| 2006/0131818 A1* | 6/2006 | Diez | F02F 11/002 |
| | | | 277/592 |
| 2007/0025081 A1* | 2/2007 | Berlin | H01L 23/44 |
| | | | 361/698 |
| 2007/0034359 A1* | 2/2007 | Liu | F28D 1/05366 |
| | | | 165/104.31 |
| 2007/0267741 A1 | 11/2007 | Attlesey et al. | |
| 2010/0039771 A1* | 2/2010 | Marchand | H05K 7/20909 |
| | | | 361/694 |
| 2011/0292595 A1* | 12/2011 | El-Essawy | G06F 1/18 |
| | | | 361/679.53 |
| 2012/0044633 A1 | 2/2012 | Attlesey | |
| 2013/0180687 A1 | 7/2013 | Campbell et al. | |
| 2013/0299232 A1 | 11/2013 | Fitz-Patrick et al. | |

OTHER PUBLICATIONS

Written Opinion for International Application No. PCT/US2015/052149, dated Jan. 13, 2016 (6 pages).

European Search Report issued in European Application No. 15844712.8 dated May 29, 2018 (7 pages).

\* cited by examiner

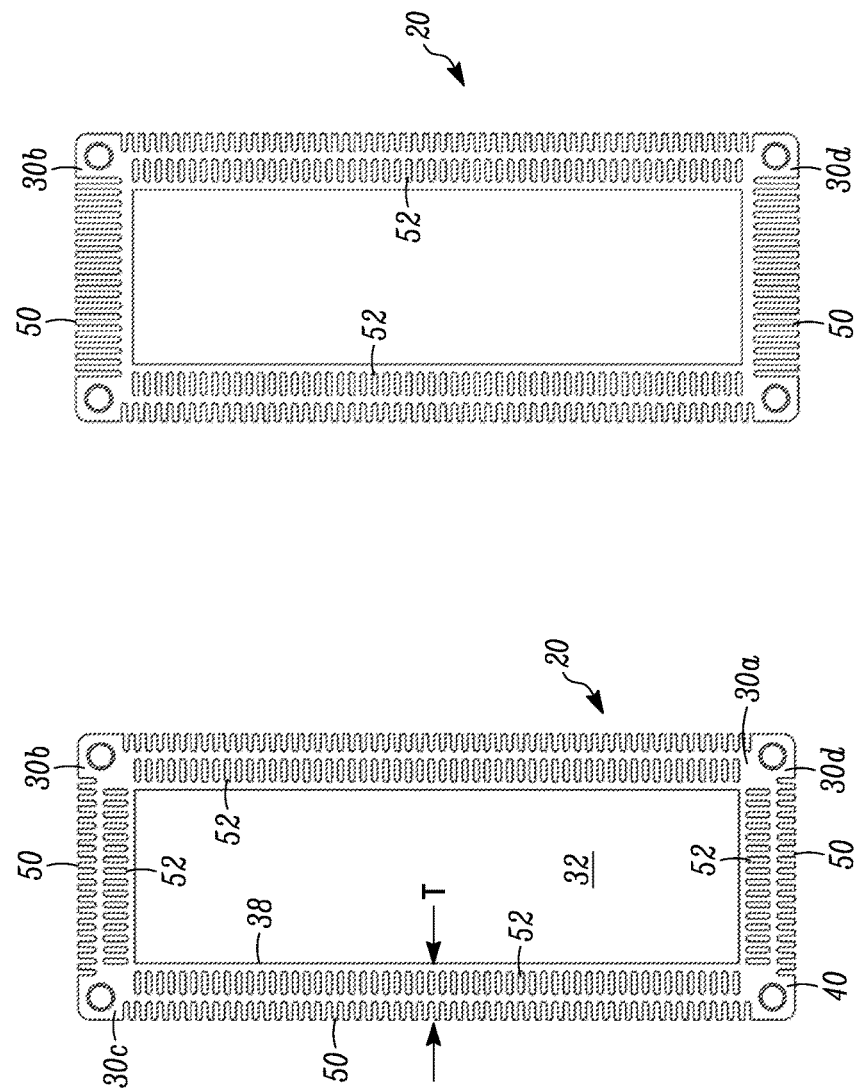

ENCLOSURE FOR LIQUID SUBMERSION COOLED ELECTRONICS

FIELD

This disclosure relates to liquid submersion cooling of electronic systems where electronic components are disposed within an enclosure and submerged within a liquid coolant that cools the electronic components.

BACKGROUND

Liquid submersion of electronics to cool the electronics through direct contact with a liquid coolant is known. Examples of liquid submersion cooling of electronics are disclosed in U.S. Pat. Nos. 7,905,106 and 7,403,392 among others. Liquid submersion cooling of electronics has a number of advantages over air cooling of electronics including increased energy efficiency by eliminating the need for fans and reducing HVAC cooling; quieter operation by eliminating fan noise; use in harsh environments since the electronics are contained in a sealed, liquid-tight enclosure that protects the electronics from humidity, salt, sand, dust and other contaminants; and high reliability by reducing or preventing thermal fatigue, corrosion and contamination of the electronics.

SUMMARY

An enclosure and an electronic system that uses the enclosure are described. The enclosure provides improved heat removal from a cooling liquid that is circulated through the electronic system for cooling the electronic components thereof which are submerged in the cooling liquid in direct contact therewith.

The enclosure is configured to house the electronic components, as well as act as a heat exchanger through which the cooling liquid is circulated to cool the cooling liquid. Since the enclosure is configured to act as a heat exchanger, it is not necessary to circulate the cooling liquid to an external heat exchanger for cooling of the liquid. However, in some embodiments, in addition to the cooling provided by the enclosure, the cooling liquid can be circulated to an external heat exchanger for additional cooling.

The enclosure uses an arrangement of a combination of external fins on one or more walls and fluid passages formed in one or more of the walls through which the cooling liquid is circulated for cooling. The fluid passages and the external fins are preferably formed on the same wall. The fins and fluid passages can be formed on any number of walls of the enclosure.

In one embodiment, the enclosure is formed by a primary housing that forms the majority of the enclosure and that is open at opposite ends, and end plates that close the open ends. One or more walls of the primary housing can be provided with the external fins and the fluid passages. In addition, external fins can be provided on one or more edges of the end plates. In one embodiment, the external fins on the end plates can align with the external fins on the wall(s) of the primary housing.

The primary housing and the end plates form a liquid-tight enclosure for holding the cooling liquid and that houses the electronics that are to be liquid submersion cooled. The electronics can be any electronics forming any electronic system that would benefit from being liquid submersion cooled. In one embodiment, the electronic system is a system that is used in a harsh environment and that has challenging thermal dissipation needs.

In one embodiment, a circulation system circulates the cooling liquid in the electronic system, with the circulation system being configured to direct the cooling liquid through the fluid passages in the wall(s) of the primary housing. In one embodiment, the circulation system can include a pump that is part of the electronic system so that the cooling liquid remains within the enclosure. In another embodiment, the pump of the circulation system is external to the electronic system so that the cooling liquid is circulated outside of the enclosure for cooling before being returned back into the enclosure.

DRAWINGS

FIGS. 10A, 10B, 10C and 10D are top/bottom end views of different embodiments of primary housings of the enclosure with the electronic components removed.

DETAILED DESCRIPTION

Figure 1:
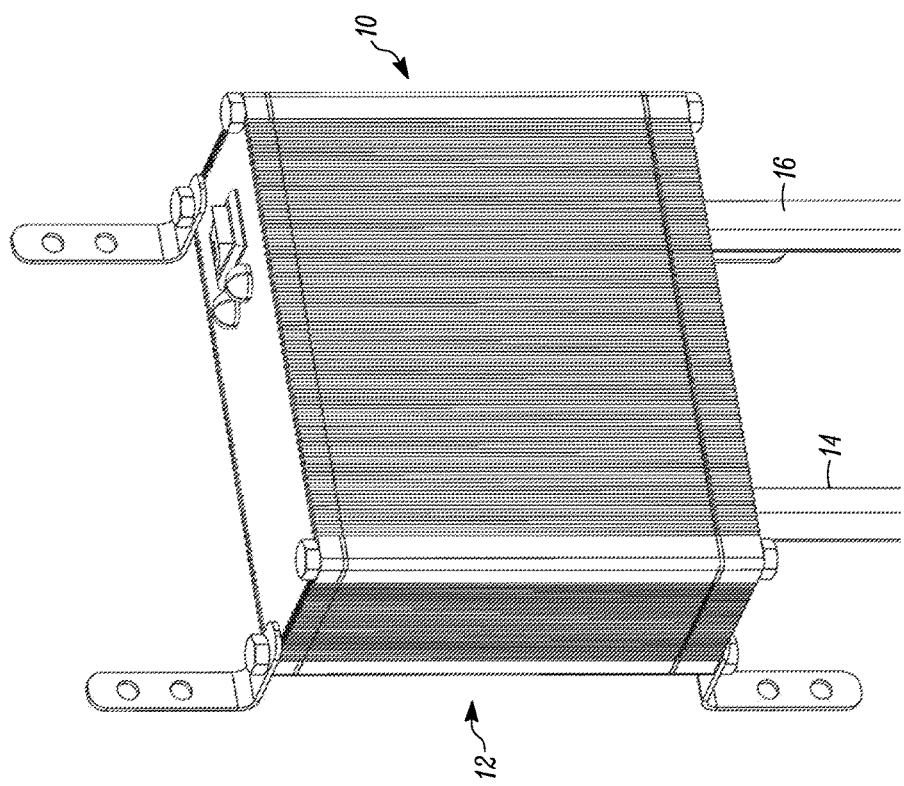
FIG. 1 is a perspective view of one embodiment of an electronic system incorporating the enclosure described herein.

With reference initially to FIG. 1, an example of an electronic system 10 incorporating an enclosure 12 described herein is illustrated. The electronic system 10 utilizes liquid submersion cooling of electronic components that are disposed within the enclosure 12. The enclosure 12 forms a liquid tight housing that houses the electronics components and the cooling liquid. The electronic components can be any electronic components forming any electronic system that would benefit from being liquid submersion cooled. In one embodiment, the electronic system 10 can be a system that is used in a harsh environment, such as in an environment where the system 10 is exposed to sand, high humidity, salt water, and other environmental challenges, and where the system 10 has challenging thermal dissipation needs.

The enclosure provides improved heat removal from a cooling liquid that is circulated through the electronic system for cooling the electronic components thereof which are submerged in the cooling liquid in direct contact therewith. Examples of liquid submersion cooling of electronics are disclosed in U.S. Pat. Nos. 7,905,106 and 7,403,392, which are incorporated herein by reference.

The cooling liquid used to submerge the electronic components can be, but is not limited to, a dielectric liquid. The cooling liquid can be single phase or two-phase. In one embodiment, the cooling liquid has a high enough thermal transfer capability to handle the amount of heat being generated by the submerged electronic components so that the cooling liquid does not change state. Enough of the cooling liquid is present in the enclosure 12 in order to submerge the heat generating components that one wishes to submerge. So in some instances the cooling liquid may fill substantially the entire enclosure 12, while in other instances the cooling liquid may only partially fill the enclosure 12.

Returning to FIG. 1, the system 10 can include one or more inputs 14 through which electrical power and/or data can be input into the enclosure 12. The system 10 can also include one or more outputs 16 through which electrical power and/or data can be output from the enclosure 12. In one embodiment, the input 14 can input electrical power and electrical power and/or data is output via the output 16. In another embodiment where electrical energy to power the system 10 is provided by one or more batteries internal to the enclosure 12, data can be input via the input 14, and electrical power and/or data is output via the output 16. Other inputs and outputs are possible depending upon the function and purpose of the system 10 and the electronic components in the enclosure 12.

With reference to FIGS. 2-6, the enclosure 12 includes a primary housing 20, an end plate 22 at one end, a sealing gasket 24 for sealing between the primary housing 20 and the end plate 22, an end plate 26 at the opposite end, and a sealing gasket 28 for sealing between the primary housing 20 and the end plate 26.

Figure 3:
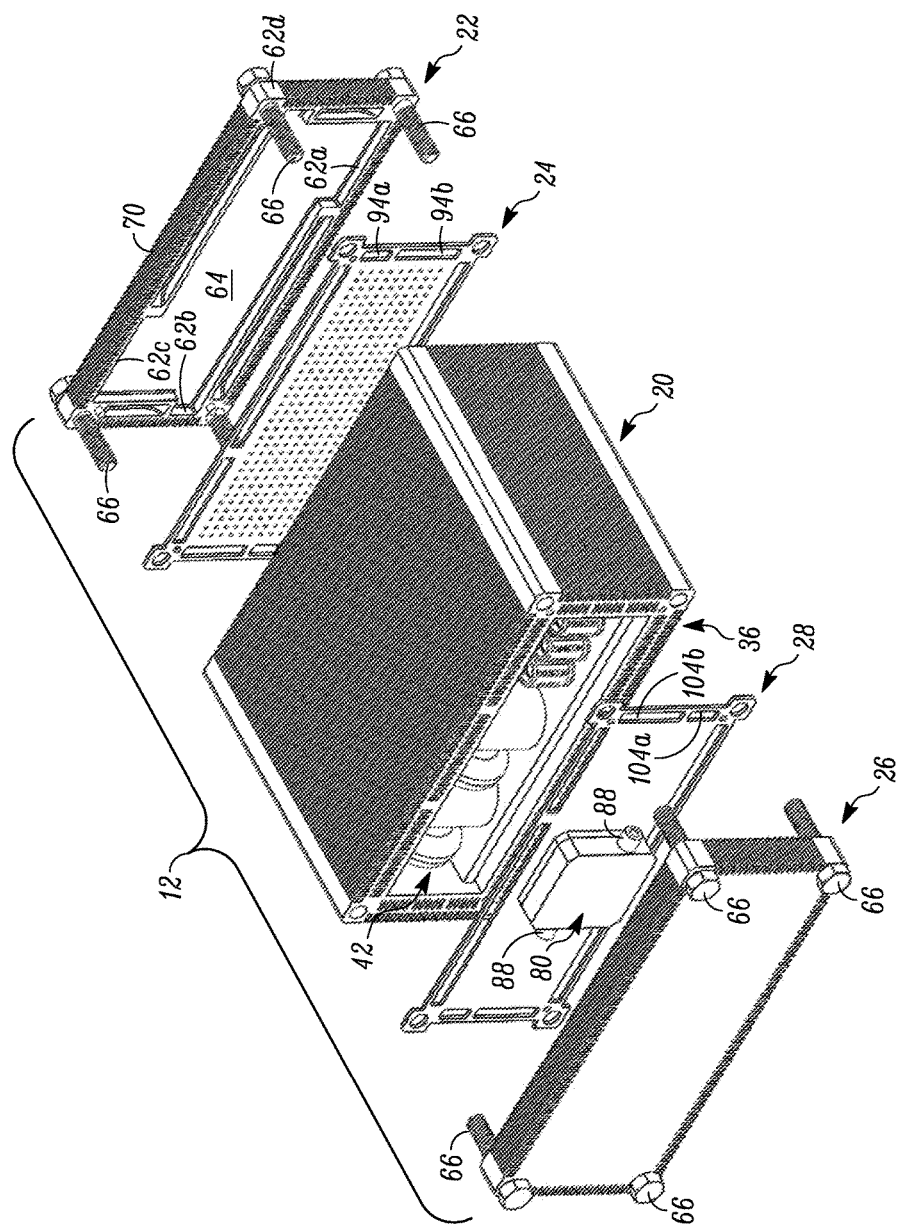
FIG. 3 is an exploded rear perspective view of the enclosure of the electronic system of FIG. 1 illustrating the components thereof.
Figure 5:
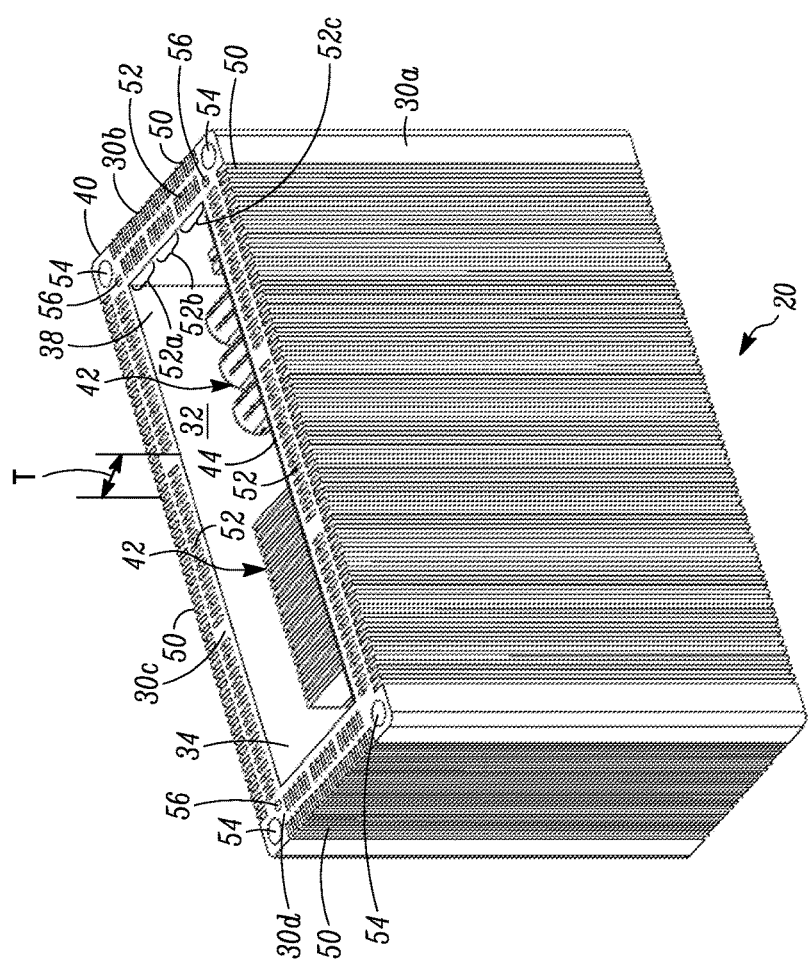
FIG. 5 is a perspective view of the primary housing of the enclosure.

With reference primarily to FIG. 5 along with FIG. 10A, the primary housing 20 is generally rectangular in configuration and has a plurality of walls 30a, 30b, 30c, 30d defining a substantially hollow, open interior space 32, a first open end 34, and a second open end 36 (visible in FIG. 3). Each wall 30a-d has a thickness T defined between an interior surface 38 and an exterior surface 40 thereof.

A plurality of electronic components 42, at least some of which are heat generating, are disposed in the interior space 32. The type of electronic components 42 used depends upon the intended construction and function of the electronic system 10. In one embodiment, the electronic components 42 are disposed on a circuit board 44 that is supported within the interior space 32 by the walls 30b, 30d so that the circuit board 44 is adjacent and substantially parallel to the wall 30a and the electronic components are generally positioned between the circuit board 44 and the wall 30c.

In use, cooling liquid (not illustrated) partially or completely fills the interior space 32 submerging the electronic components 42 that one wishes to submersion cool using the cooling liquid.

With continued reference to FIG. 5 along with FIG. 10A, one or more of the walls 30a-d includes a combination of a plurality of heat dissipating fins 50 formed on the exterior surface 40 thereof, and a plurality of fluid passages 52 formed in the thickness T of the wall thereof between the interior surface 38 and the exterior surface 40. The fluid passages 52 are arranged generally between base ends of the fins 50 and the interior surface 38.

In use, the cooling liquid is circulated through the fluid passages 52 to cool the cooling liquid after the cooling liquid has exchanged heat with the electronic components 42. The heat from the cooling liquid is transferred through the material forming the wall(s) of the primary housing 20 to the fins 50. Heat is then dissipated from the fins 50 into the ambient air. If desired, heat dissipation from the fins 50 can be enhanced by employing one or more fans (not shown) to direct air flow over the fins 50.

The construction and arrangement of the fins 50 and the fluid passages 52, and which walls 30a-d they are provided on, can vary based on a number of factors including, but not limited to, the cooling that one wishes to achieve, the type of electronic components 42 used and the arrangement/location of the electronic components in the interior space 32.

In the examples illustrated in FIGS. 1-9 and 10A, each of the walls 30a-d is provided with the fins 50 and the fluid passages 52. However, not all walls need to be provided with either or both of the fins 50 and the fluid passages 52. For example, FIG. 10B illustrates the walls 30b, 30d being formed with the fins 50 but not with the fluid passages 52. In FIG. 10B, the fins 50 on the walls 30b, 30d can be made longer than the fins 50 on the walls 30b, 30d in FIG. 10A due to the lack of the fluid passages 52 in order to provide more surface area for heat exchange.

Figure 10C:
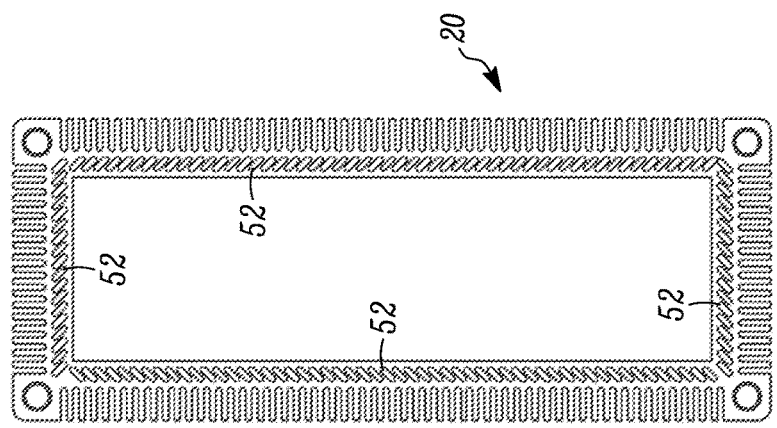
Figure 10D:
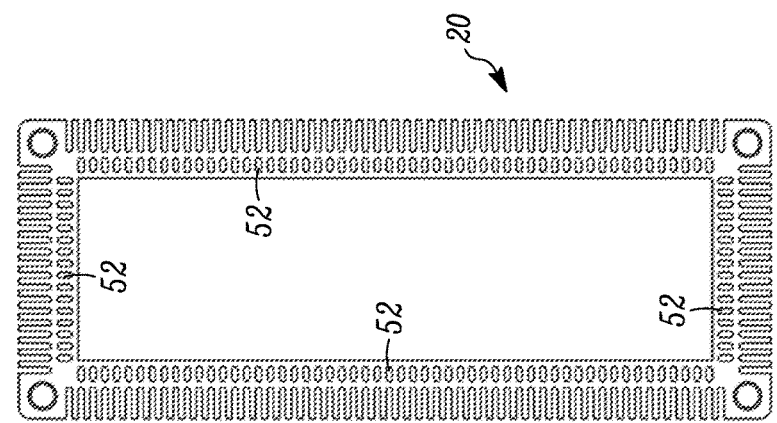

In addition, the arrangement of the fluid passages 52 on the walls 30a-d can vary to tailor the cooling performance. For example, as shown in FIG. 5, the fluid passages 52 in one or more of the sidewalls 30a-d can be grouped together into groups or clusters 52a, 52b, 52c along one, some, or all of the walls. In FIG. 10A, the fluid passages 52 are illustrated as being evenly spaced from one another along the length of one, some, or all of the walls 30a-d. In FIG. 10B, the fluid passages 52 are illustrated as being evenly spaced along the walls 30a, 30c. In FIG. 10C, the fluid passages 52 are illustrated as being shorter in length (i.e. measured in the thickness T direction) than the fluid passages in FIGS. 5, 10A, and 10B, which permits the use of longer fins 50 for increase surface area for heat exchange, and the fluid passages are evenly spaced. In FIG. 10D, the fluid passages 52 are illustrated as being evenly spaced, but are angled relative to the thickness T direction.

In the illustrated examples, the fins 50 and the fluid passages 52 extend continuously from the open end 34 to the other open end 36. However, the fins 50 and the fluid passages 52 need not be continuous from the end 34 to the end 36. In addition, the fins 50 and the fluid passages 52 in each wall extend substantially parallel to one another and extend substantially parallel to a longitudinal axis of the primary housing 20 that extends from the open end 34 to the open end 36.

Many other variations of the fins 50 and the fluid passages 52, and which of the walls 30a-d are or are not provided with one or both, can be utilized.

The primary housing 20 can be made from any heat conducting material including plastics, metals such as aluminum, or the like. In one embodiment, the primary housing 20 is formed by extrusion so that it is a single, unitary, one-piece construction of a material such as plastic or aluminum. An example of an extruded housing for an electronic system is described in U.S. Pat. No. 8,089,765.

Returning to FIG. 5, the primary housing 20 can also be provided with fastener holes 54 at each end 34, 36 for receipt of fasteners used to secure the end plates 22, 26 to the primary housing as discussed further below. In addition, in some embodiments, locator pin holes 56 can be provided near some or all of the holes 54 at both ends 34, 36 for receipt of locator pins discussed further below.

The end plates 22, 26 can be formed from the same heat conducting material(s) as the primary housing 20, including plastics, metals such as aluminum, or the like. In one embodiment, the end plates 22, 26 may be formed by extrusion so that it is a single, unitary, one-piece construction of a material such as plastic or aluminum.

Figure 2:
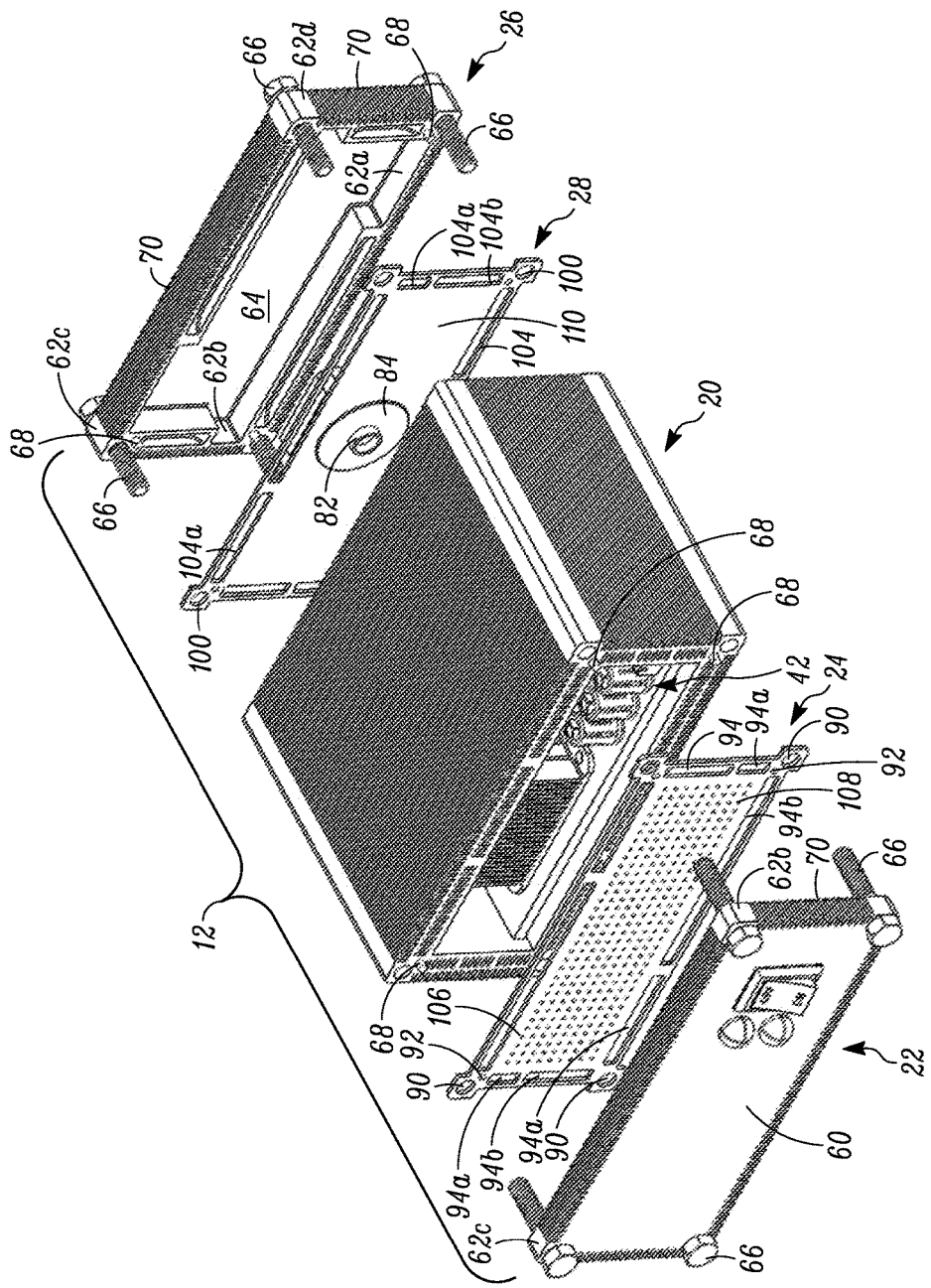
FIG. 2 is an exploded front perspective view of the enclosure of the electronic system of FIG. 1 illustrating the components thereof.
Figure 4:
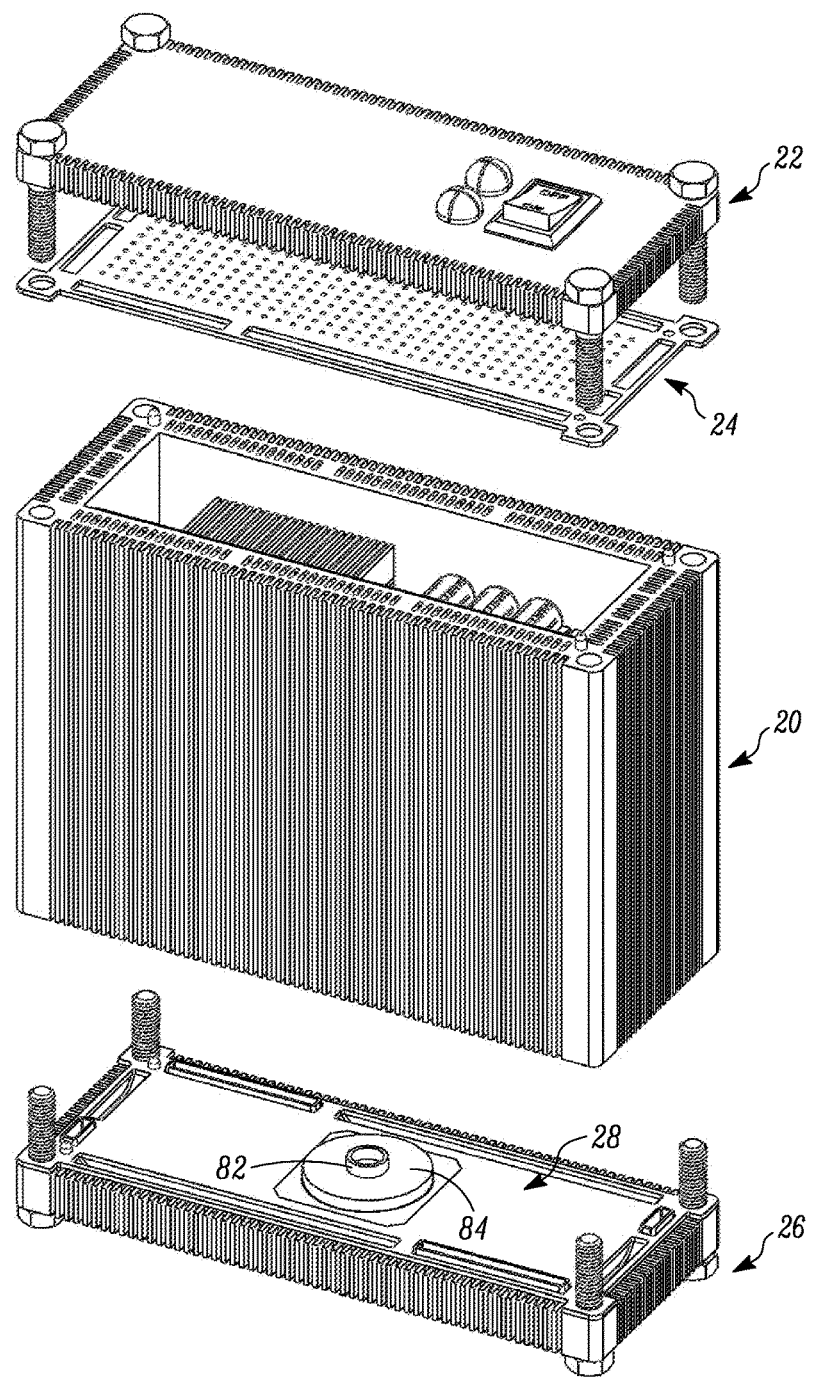
FIG. 4 is another exploded view of the electronic system of FIG. 1.

With reference to FIGS. 2-4, the end plates 22, 26 are each of generally rectangular construction matching the generally rectangular construction of the primary housing 20. The end plates 22, 26 are designed to be detachably fastened to the respective open ends 34, 36 of the primary housing 20 to close off the open ends 34, 36. Each end plate 22, 26 includes a base plate 60 and perimeter side walls 62a, 62b, 62c, 62d that extend from the base plate 60. The base plate 60 and the side walls 62a-d create a recessed area 64 on each end plate 22, 26.

The end plates 22, 26 can be detachably fastened to the primary housing 20 via any form of attachment technique. In the illustrated examples, mechanical fasteners 66 such as screws extend through holes in the end plates 22, 26 and into the holes 54 in the primary housing 20 to secure the end plates 22, 26 in position. The end plates 22, 26 can also include locator pin holes that correspond in position to the locator pin holes 56 in the primary housing 20. In one embodiment, the locator pins 68 can be positioned in the locator pin holes 56 of the primary housing 20 (for example as shown in FIG. 2) for fitting into the locator pin holes of the end plates 22, 26 when the end plates are attached the primary housing. In another embodiment, the locator pins 68 can be positioned in the locator pin holes of the end plates 22, 26 (for example, as shown in the end plate 26 in FIG. 2) for fitting into the locator pin holes 56 of the primary housing when the end plates are attached the primary housing. In another embodiment, the locator pins 68 can be positioned in the locator pin holes 56 of the primary housing 20 at one end, and positioned in the locator pin holes of the end plate at the opposite end, for fitting into the corresponding locator pins holes of the end plate and primary housing when the end plates are attached to the primary housing. Regardless of where the locator pins 68 are initially located, the locator pins 68 help properly position the end plates 22, 26 relative to the primary housing 20 and also help to properly position the sealing gaskets 24, 28 as discussed further below.

Figure 6:
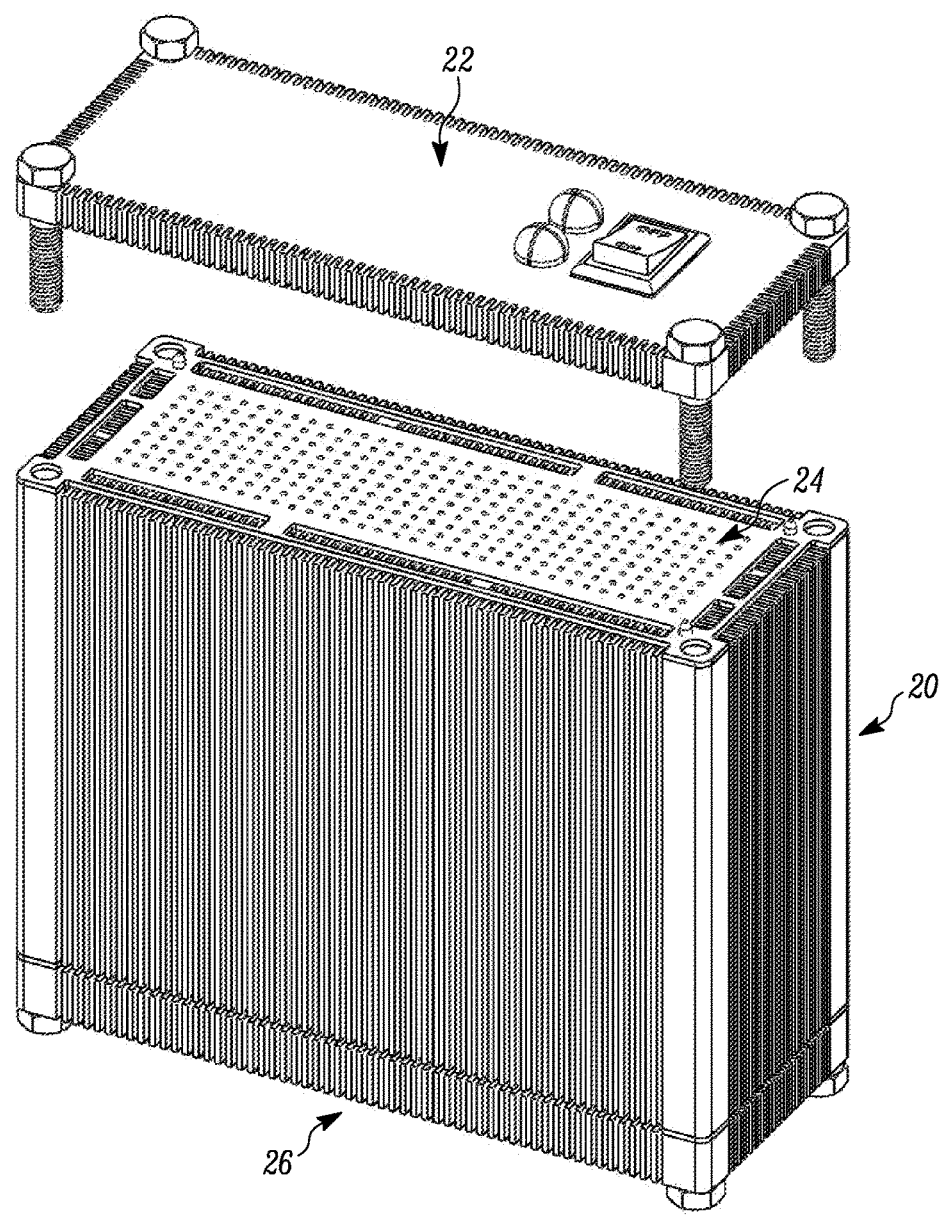
FIG. 6 illustrates how the sealing gasket at one end of the primary housing seats on the primary housing.
Figure 7:
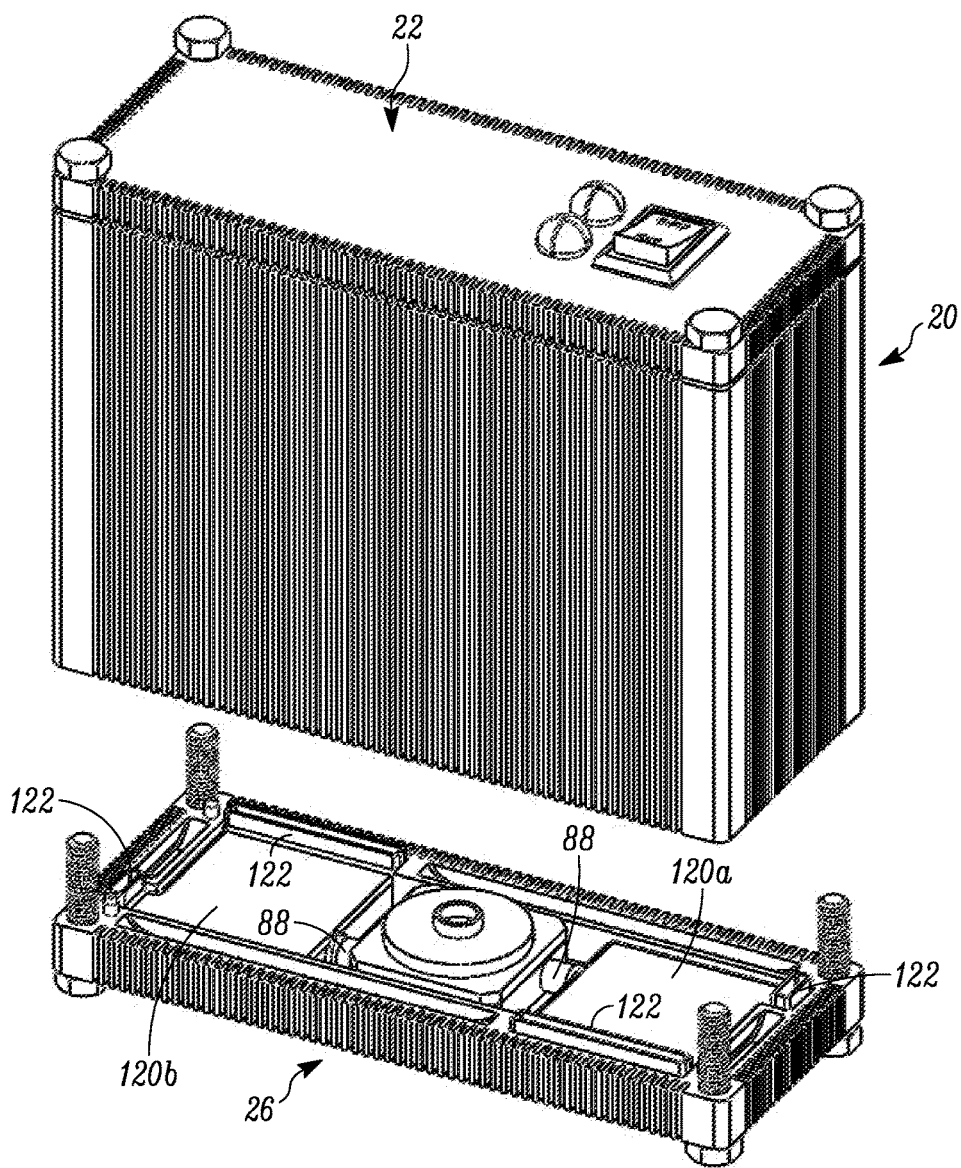
FIG. 7 illustrates another embodiment of the pump side end plate.

With continued reference to FIGS. 2-4, one or more of the side walls 62a-d of one or more of the end plates 22, 26 are formed with heat dissipation fins 70 on an exterior surface thereof. In the illustrated examples, each of the side walls 62a-d is provided with the fins 70. However, not all of the side walls 62a-d need to be provided with the fins 70. In one embodiment, the arrangement of the fins 70 on the side walls 62a-d correspond to the arrangement of the fins 50 on the corresponding walls 30a-d of the primary housing 20. In one embodiment, the number of the fins 70 on each of the side walls 62a-d corresponds with the number of the fins 50 on the corresponding wall 30a-d. In another embodiment, not only does the number of fins correspond, but the fins 70 can be substantially aligned with, and effectively form a continuation of, the fins 70 on the walls 30a-d as can be seen in FIGS. 6 and 7.

With reference to FIGS. 2 and 3, in one embodiment the recessed area 64 of the end plate 22 forms a return or input plenum for cooling liquid returning through the passages 52 after being cooled. Similarly, in another embodiment, the recessed area 64 of the end plate 26 forms an output plenum for cooling liquid after the liquid has exchanged heat with the electronic components and is to be circulated through the passages 52 for cooling.

The cooling liquid is circulated by a circulation system that includes a pump 80. The pump 80 pumps cooling liquid from the interior space 32 and into the recessed area 64 of the end plate 26. The cooling liquid is then directed by the circulation system from the recessed area 64 into some or all of the passages 52 at the open end 36 of the primary housing 20. The cooling liquid then flows through the passages 52 where the liquid is cooled, and then flows out of the passages 52 at the open end 34 and into the recessed area 64 of the end plate 22. The cooling liquid is then returned by the circulation system back into interior space 32 through the open end 34.

The pump 80 can be located at any position suitable for achieving its pumping functions. In one embodiment, the pump 80 can be mounted on the sealing gasket 28 and positioned in the recessed area 64 of the end plate 26 as illustrated in FIGS. 2-4 and 7-8. In this example, the pump 80 is mounted on one side of the gasket 28 and includes an inlet tube 82 and a circular enlargement 84 that is disposed within a circular opening 86 (see FIG. 9) in the gasket 28 in close fitting relationship therewith to mount the pump 80 on the gasket 28 and generally prevent fluid leakage between the enlargement 84 and the circular opening 86.

Referring to FIG. 3, the pump 80 includes at least one outlet 88 to direct the cooling liquid into the recessed area 64 of the end plate 26.

In another embodiment, the pump can be located in the interior space 32 of the primary housing 20. In another embodiment, the pump can be mounted on the gasket 24 and pumps the cooling liquid in a direction opposite to that described above. In another embodiment, the pump is not mounted on the gasket, but is instead mounted on one of the end plates 22, 26 and includes an input that extends through the sealing gasket. In still another embodiment, more than one pump is provided.

The pump(s) 80 can have any mechanical design known in the art that is suitable for pumping the cooling liquid, for example a centrifugal pump.

The sealing gaskets 24, 28 are configured to seal the joint between the end plates 22, 26 and the open ends 36, 36 of the primary housing and prevent leakage of cooling liquid from the enclosure. The sealing gaskets 24, 28 can also be configured to control the flow of cooling liquid within the enclosure 12. The gaskets 24, 28 can be formed of any material, such as rubber, silicone, metal, felt, Neoprene, fiberglass, or a plastic polymer such as polychlorotrifluoroethylene, or the like, that is suitable for performing the sealing and flow control functions.

With reference to FIGS. 2 and 3, the sealing gasket 24 comprises a generally planar, generally rectangular sheet with through holes 90 at the corners thereof through which the fasteners 66 extend. Additional through holes 92 are provided near the through holes 90 through which the locator pins 68 extend. At least one fluid opening 94 is formed through the gasket 24 along at least one edge thereof. The fluid opening 94 aligns with the outlets of the passages 52 at the open end 34 of the primary housing 20 to allow cooling liquid that has been cooled to flow out of the passages 52, through the gasket 24 and into the recessed area 64 of the end plate 22.

The number, size, and shape of the fluid opening 94 can be selected to control the flow of cooling liquid out of the passages 52. For example, as illustrated in FIGS. 2 and 3, the gasket 24 has two of the openings 94 along each edge of the gasket, with one of the openings 94a having a size to permit flow out of one of the groups or clusters 52a, 52b, 52c of passages in the primary housing, and one of the openings 94*b* having a larger size that permits flow out of two of the groups or clusters 52*a*, 52*b*, 52*c* of passages in the primary housing 20.

The sealing gasket 28 has a construction that is similar to the gasket 24. In particular, the gasket 28 can be a generally planar, generally rectangular sheet with through holes 100 at the corners thereof through which the fasteners 66 extend. Additional through holes 102 are provided near the through holes 100 through which the locator pins 68 extend. At least one fluid opening 104 is formed through the gasket 28 along at least one edge thereof. The fluid opening 104 aligns with the inlets of the passages 52 at the open end 36 of the primary housing 20 to allow cooling liquid to be cooled to flow from the recessed area 64 of the end plate 26, through the gasket 28, and in to the passages 52.

The number, size, and shape of the fluid opening 104 can be selected to control the flow of cooling liquid into the passages 52. For example, as illustrated in FIGS. 2 and 3, the gasket 28 has two of the openings 104 along each edge of the gasket, with one of the openings 104*a* having a size to permit flow into one of the groups or clusters 52*a*, 52*b*, 52*c* of passages in the primary housing, and one of the openings 104*b* having a larger size that permits flow into two of the groups or clusters 52*a*, 52*b*, 52*c* of passages in the primary housing 20.

Figure 9:
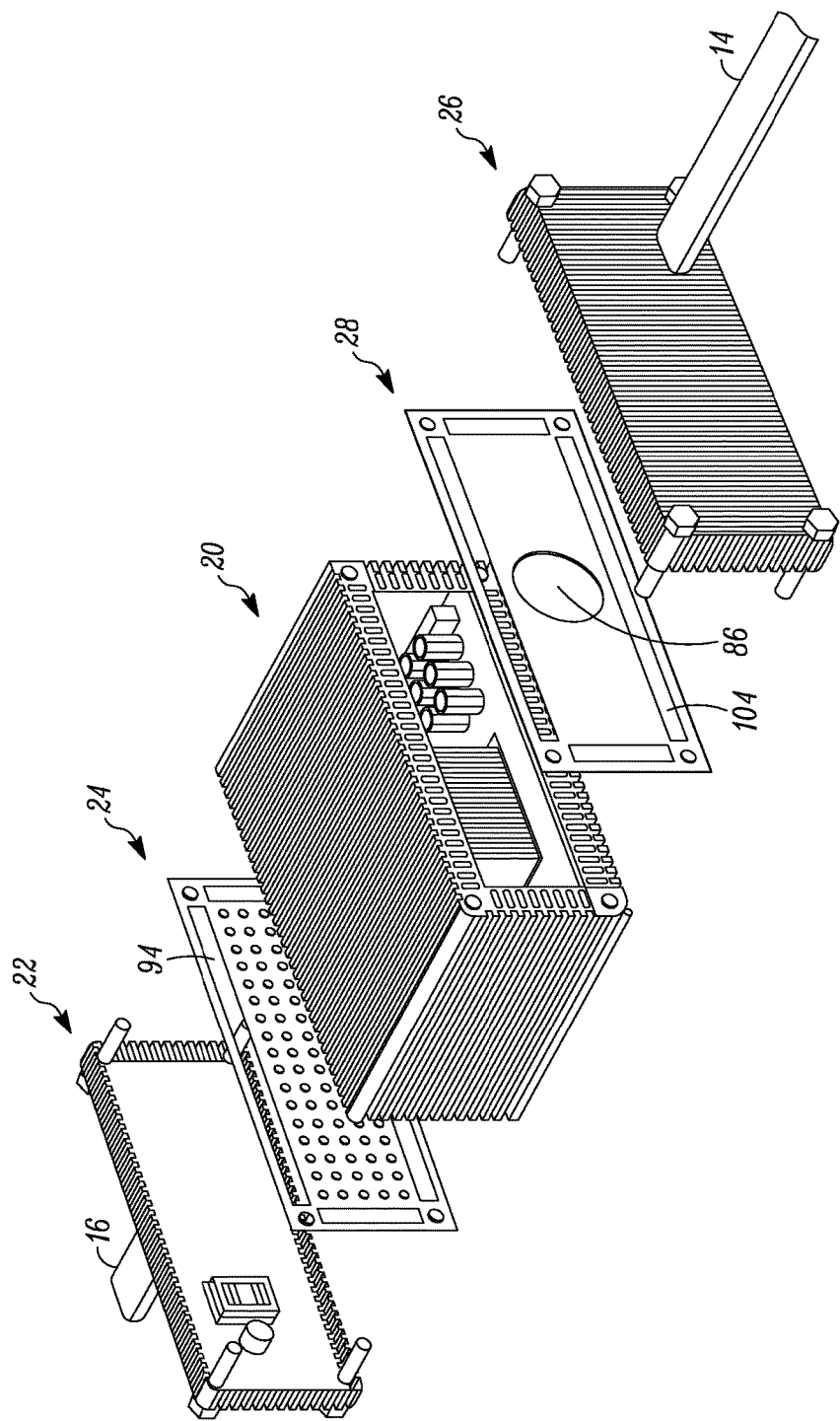
FIG. 9 is an exploded view of another embodiment of an electronic system incorporating an enclosure described herein.

Other numbers, sizes, and shapes of the fluid openings 94, 104 are possible. For example, as illustrated in FIG. 9, the gaskets 24, 28 can have single, large openings 94, 104 along each edge thereof that align with all of the passages 52.

Returning to FIG. 2, the sealing gasket 24 includes a central portion 106 that blocks the free flow of cooling liquid from the recessed area 64 back into the interior space 32 of the primary housing 20. However, the central portion 106 is provided with a plurality of holes 108. The holes 108 help to stratify the flow of the cooling liquid and create a uniform flow field as it flows back into the interior space 32. In addition, the holes 108 create discrete jets of cooling liquid therefrom which may impinge on one or more of the electronic components 42 to create an impingement cooling effect. The number of the holes 108, the location of the holes 108, the size of the holes 108, and/or the concentration of the holes 108 can each be tailored as desired to create the desired flow and cooling effects.

As shown in FIG. 2, the gasket 28 includes a central portion 110 that is solid and devoid of openings or holes. The solid central portion 110 fluidly separates the interior space 32 from the recessed area 64 of the end plate 26 so that the cooling liquid must flow through the pump 80 in order to reach the recessed area 64.

Figure 8:
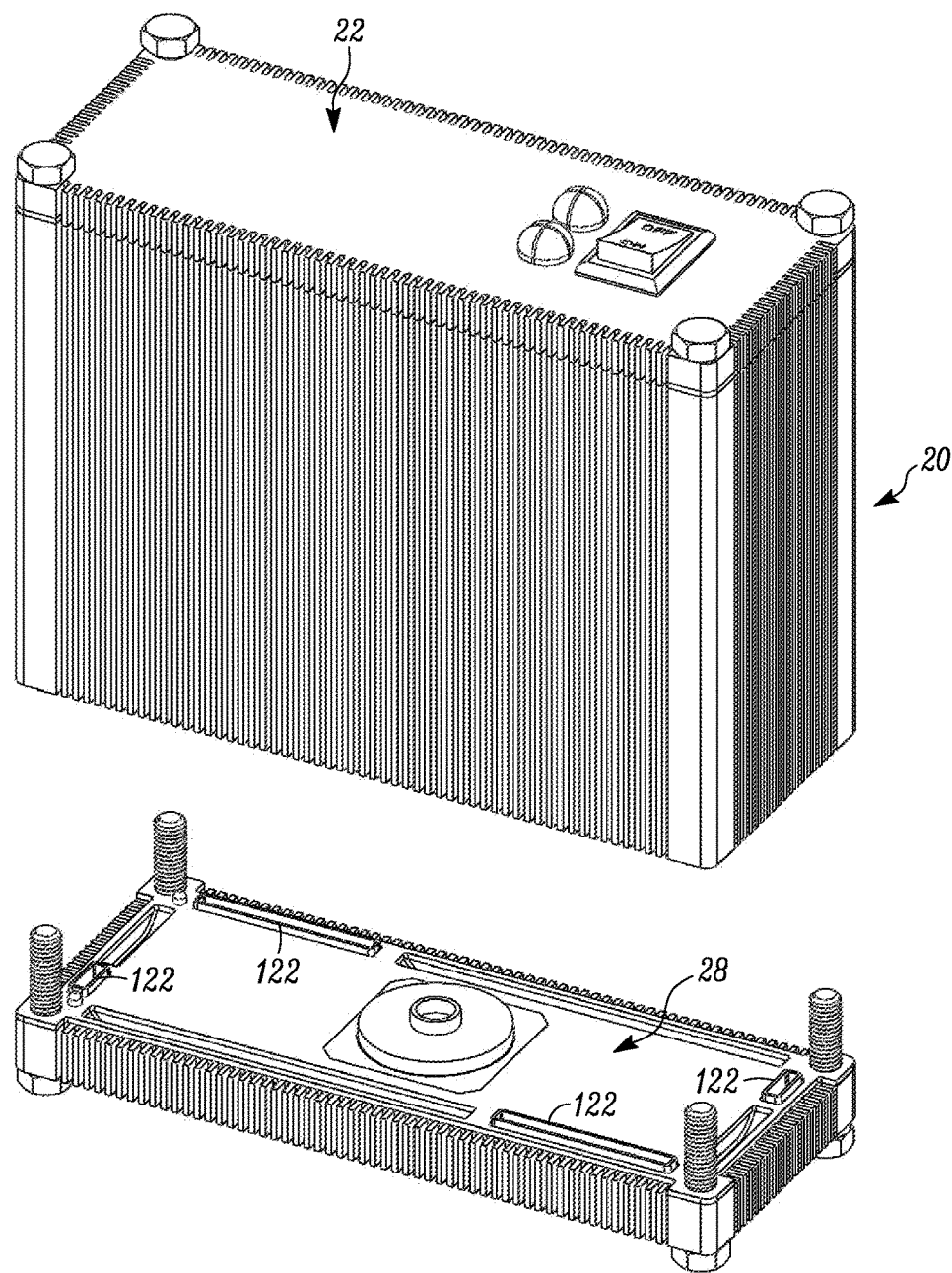
FIG. 8 is a view similar to FIG. 7 but with the sealing gasket in place.

With reference to FIGS. 7 and 8, a modification of the end plate 26 is illustrated. In this embodiment, the outlets 88 of the pump 80 are fluidly connected to enclosed plenums 120*a*, 120*b* that fit within the recessed area of the end plate 26. All of the cooling liquid that flows through the pump 80 is directed into the plenums 120*a*, 120*b*. The plenums 120*a*, 120*b* are provided with one or more outlets 122, in the illustrated example two outlets 122. The outlets 122 correspond in shape and size to corresponding ones of the fluid openings 104*a*, 104*b* formed in the gasket 28 so that the outlets 122 fit into and through the fluid openings 104*a*, 104*b* as seen in FIG. 8. The outlets 122 help direct the flow of the cooling liquid into desired ones of the groups or clusters 52*a*, 52*b*, 52*c* of passages in the primary housing 20. The number of outlets 122 used, the positions of the outlets 122, and the size and/or shape of the outlets 122 can be changed as desired to alter the flow path of the cooling liquid and thereby tailor the cooling performance that is achieved.

In one embodiment, plenums similar to the plenums 120*a*, 120*b* can be used in the end plate 22 that would receive cooling liquid that is output from the passages 52. The plenums would include one or more outlets that extend through suitable openings provided in the central portion 106 of the gasket 24 to direct the return flow of cooling liquid directly onto certain ones of the electronic components to impingement cool the components.

Figure 11:
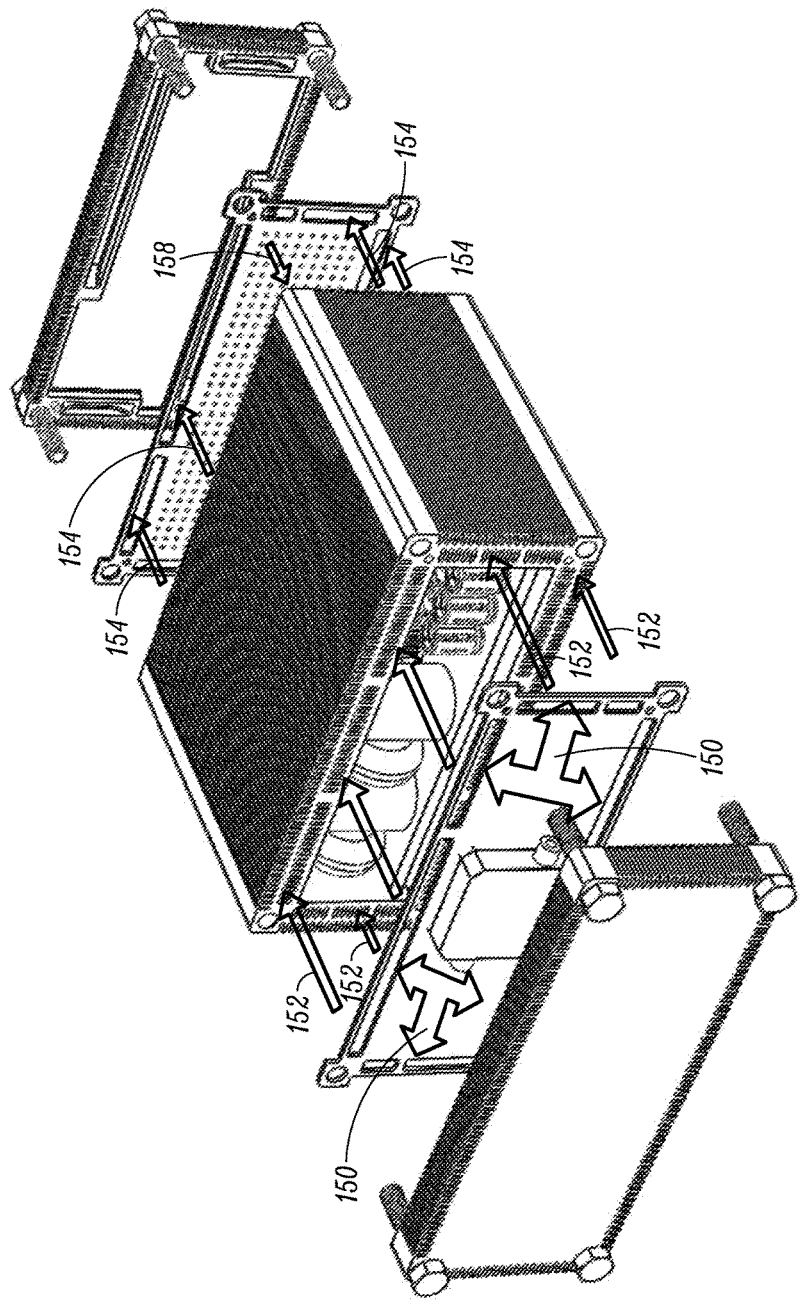
FIGS. 11 and 12 are similar to FIGS. 3 and 2, respectively, showing an embodiment of flow paths through the enclosure.
Figure 12:
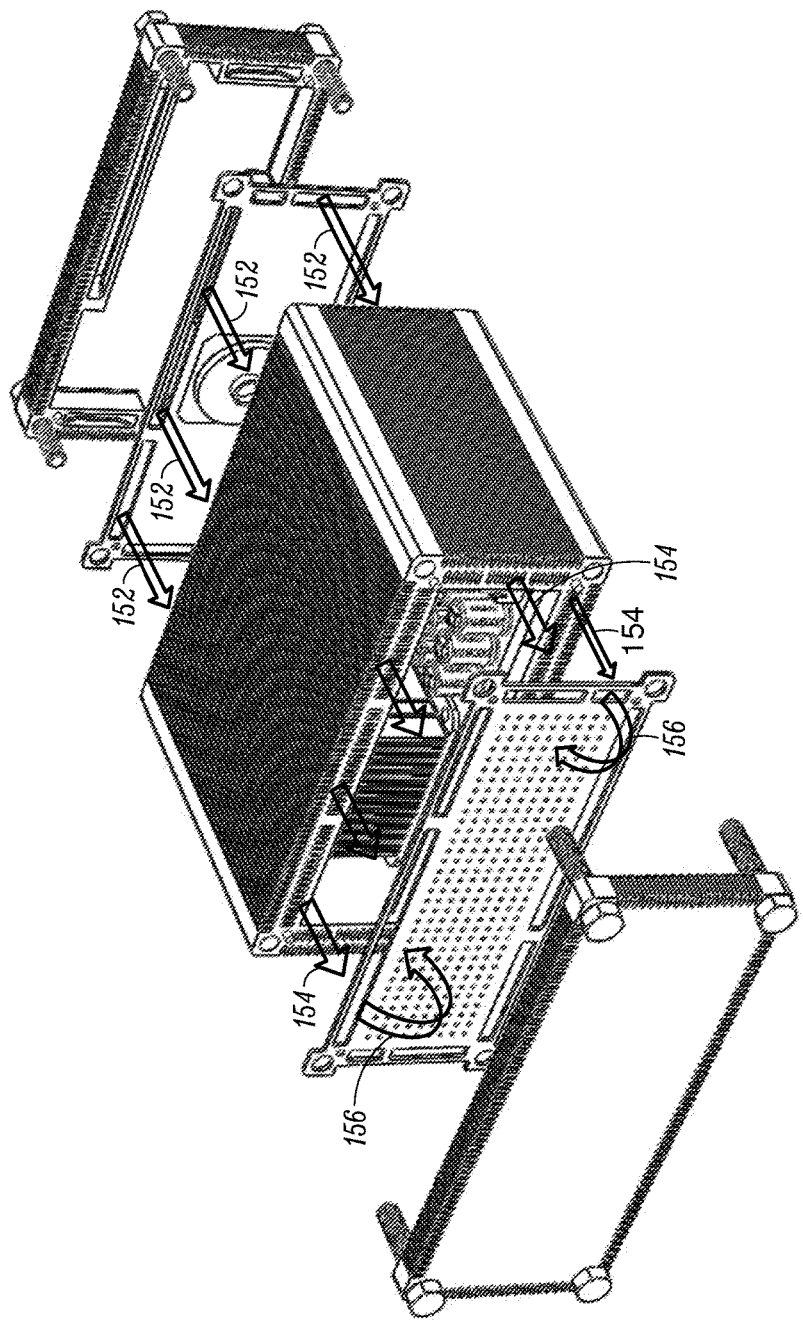

One example of a cooling operation in the electronic system 10 will now be described with reference to FIGS. 11 and 12, together with FIGS. 2-6. It is to be realized that other embodiments described herein operate in a similar manner. The enclosure 12 is initially assembled and filled with cooling liquid to a desired fill level sufficient to submerge the electronic components that one wishes to submersion cooling using the cooling liquid. To fill the enclosure 12, a suitable plugged fill port can be provided, for example on one of the end plates 22, 26 with the plug being removable from the fill port to permit filling with the cooling liquid. Alternatively, the enclosure 12 can be oriented vertically as shown in FIGS. 1 and 6, and the upper end plate 22 removed to permit filling of the interior space.

During operation of the electronic system 10, the electronic components thereof generate heat. Since the electronic components are submerged in the cooling liquid in direct contact therewith, the cooling liquid will absorb the generated heat. To remove the absorbed heat from the cooling liquid, the cooling liquid is circulated by the pump 80. In particular, the pump 80 draws in cooling liquid through its inlet 82 and outputs the liquid into the recessed area 64 of the end plate 26 as shown by the arrows 150 in FIG. 11. The end plate 26 will absorb some portion of the heat with the external fins 70 thereof helping to dissipate the absorbed heat to ambient. The cooling liquid then flows from the recessed area 64 through the fluid opening(s) 104 in the gasket 28 as shown by the arrows 152 in FIGS. 11 and 12 and into the fluid passages 52 formed in the wall(s) of the primary housing 20. The wall(s) of the primary housing 20 absorbs heat from the cooling liquid with the external fins 50 helping to dissipate the absorbed heat to ambient. The cooling liquid then exits out of the fluid passages 52 as shown by the arrows 154 in FIGS. 11 and 12, and then through the fluid opening(s) 94 in the gasket 24 and into the recessed area 64 in the end plate 22 as shown by the arrows 156. The end plate 22 will absorb some portion of the heat with the external fins 70 thereof helping to dissipate the absorbed heat to ambient. The now cooled cooling liquid then flows through the holes 108 in the central portion 106 of the gasket 24 back into the interior space 32 of the primary housing as shown by the arrows 156, 158 in FIGS. 11 and 12.

The pump 80 can run continuously whenever the electronic system 10 is operating. In another embodiment, the pump 80 can be controlled to operate periodically, for example being turned on at periodic time intervals and operating for a certain period of time. In still another embodiment, the pump 80 can be controlled intermittently, for example by being controlled based on the temperature of the cooling liquid and only being turned on when the cooling liquid reaches a predetermined temperature and being turned off when the cooling liquid has been cooled back down to a predetermined temperature.

In some embodiments, the cooling liquid does not need to be circulated. Instead, the heat absorption capacity of the cooling liquid can be sufficient to absorb sufficient heat, with the heat then being dissipated from the cooling liquid via contact of the cooling liquid with the walls of the enclosure 12 and/or the end plates 22, 26 which direct the heat through the walls and to the external fins where the heat is dissipated to ambient air.

The concepts described may be embodied in other forms without departing from the spirit or novel characteristics thereof. The examples disclosed in this application are to be considered in all respects as illustrative and not limitative.

The invention claimed is:

1. An electronic system, comprising:
    an enclosure that includes a primary housing, a first end plate, and a second end plate;
    the primary housing having a plurality of walls defining an interior space, a first open end, and a second open end;
    each wall having a thickness defined between an interior surface and an exterior surface thereof;
    a first one of the walls includes a plurality of heat dissipating fins formed on the exterior surface thereof, each heat dissipating fin having a longitudinal axis;
    a plurality of fluid passages in the first wall inward from the fins, the fluid passages extend from the first open end to the second open end, each fluid passage having a longitudinal axis, and the longitudinal axes of the fluid passages are parallel to the longitudinal axes of the heat dissipating fins;
    heat generating electronic components disposed in the interior space;
    the first end plate is removably attached to the primary housing at the first open end thereof and closes the first open end, the first end plate includes a plurality of heat dissipating fins on an exterior surface thereof;
    a first sealing gasket between the first end plate and the primary housing at the first open end thereof to seal between the first end plate and the primary housing to prevent fluid leakage between the first end plate and the primary housing, the first sealing gasket includes at least one fluid opening formed therethrough that is aligned with the fluid passages to permit fluid flow through the first sealing gasket;
    the first sealing gasket is formed from rubber, silicone, neoprene, or plastic polymer;
    the second end plate is removably attached to the primary housing at the second open end thereof and closes the second open end, the second end plate includes a plurality of heat dissipating fins on an exterior surface thereof;
    a second sealing gasket between the second end plate and the primary housing at the second open end thereof to seal between the second end plate and the primary housing to prevent fluid leakage between the second end plate and the primary housing, the second sealing gasket includes at least one fluid opening formed therethrough that is aligned with the fluid passages to permit fluid flow through the second sealing gasket;
    the second sealing gasket is formed from rubber, silicone, neoprene, or plastic polymer;
    a cooling liquid within the interior space and submerging the heat generating electronic components in direct contact therewith; and
    a circulation system that circulates the cooling liquid in the electronic system, the circulation system is configured to direct the cooling liquid through the fluid passages in the first wall, the circulation system includes a pump, and the pump is mounted in the primary housing or on the first or second end plate and the cooling liquid remains within the enclosure while being circulated.

2. The electronic system of claim 1, further comprising an electrical energy input that provides electrical energy for powering the heat generating electronic components.

3. The electronic system of claim 1, wherein the heat dissipating fins on the first wall extend from the first open end to the second open end.

4. The electronic system of claim 1, further comprising a second one of the walls includes a plurality of heat dissipating fins formed on the exterior surface thereof, the second wall further includes a plurality of fluid passages inward from the heat dissipating fins on the second wall, and the circulation system is configured to direct the cooling liquid through the fluid passages in the second wall.

5. The electronic system of claim 1, wherein each of the walls includes a plurality of heat dissipating fins formed on the respective exterior surface thereof, each wall further includes a plurality of fluid passages inward from the heat dissipating fins on the respective wall, and the circulation system is configured to direct the cooling liquid through the fluid passages in each of the walls.

6. The electronic system of claim 1, wherein the primary housing consists essentially of extruded Aluminum.

7. The electronic system of claim 1, wherein the heat dissipating fins on the first wall are aligned with the heat dissipating fins on the first end plate and with the heat dissipating fins on the second end plate.

8. An enclosure for an electronic system, comprising:
    a primary housing that includes a plurality of walls defining an interior space, a first open end, and a second open end, the primary housing is formed from a plastic or metal material;
    a first end plate removably attached to the primary housing at the first open end thereof and closing the first open end, the first end plate includes a plurality of heat dissipating fins on an exterior surface thereof;
    each wall having a thickness defined between an interior surface and an exterior surface thereof;
    each of the walls includes a plurality of heat dissipating fins formed on the respective exterior surface thereof, each heat dissipating fin on the walls having a longitudinal axis;
    each wall further includes a plurality of fluid passages inward from the heat dissipating fins on the respective wall, each fluid passage having a longitudinal axis, and the longitudinal axes of the fluid passages are parallel to the longitudinal axes of the heat dissipating fins on the walls, and the fluid passages extend from the first open end to the second open end, and the heat dissipating fins on the walls extend from the first open end to the second open end;
    a first sealing gasket between the first end plate and the primary housing at the first open end thereof to seal between the first end plate and the primary housing to prevent fluid leakage between the first end plate and the primary housing, the first sealing gasket includes at least one fluid opening formed therethrough that is aligned with the fluid passages to permit fluid flow through the first sealing gasket;
    a second end plate removably attached to the primary housing at the second open end thereof and closing the second open end, the second end plate includes a plurality of heat dissipating fins on an exterior surface thereof;
    a second sealing gasket between the second end plate and the primary housing at the second open end thereof to seal between the second end plate and the primary housing to prevent fluid leakage between the second end plate and the primary housing, the second sealing gasket includes at least one fluid opening formed therethrough that is aligned with the fluid passages to permit fluid flow through the second sealing gasket;

the heat dissipating fins on the first and second end plates are aligned with, and form a continuation of, the heat dissipating fins on the walls;

and one or more of the following:

a) the first sealing gasket and the second sealing gasket are formed from rubber, silicone, neoprene, or plastic polymer;

b) the first sealing gasket has a construction that is different than the second sealing gasket.

9. The enclosure for an electronic system of claim 8, wherein the primary housing consists essentially of extruded Aluminum.

10. An electronic system, comprising:

an enclosure that includes a primary housing, a first end plate, and a second end plate;

the primary housing having a plurality of walls defining an interior space, a first open end, and a second open end;

each wall having a thickness defined between an interior surface and an exterior surface thereof;

a first one of the walls includes a plurality of heat dissipating fins formed on the exterior surface thereof, each heat dissipating fin having a longitudinal axis;

a plurality of fluid passages in the first wall inward from the heat dissipating fins, the fluid passages extend to the first open end and extend to the second open end, each fluid passage having a longitudinal axis, and the longitudinal axes of the fluid passages are parallel to the longitudinal axes of the heat dissipating fins;

heat generating electronic components disposed in the interior space;

the first end plate is removably attached to the primary housing at the first open end thereof and closes the first open end;

a first sealing gasket between the first end plate and the primary housing at the first open end thereof to seal between the first end plate and the primary housing to prevent fluid leakage between the first end plate and the primary housing, the first sealing gasket includes at least one fluid opening formed therethrough that is aligned with the fluid passages to permit fluid flow through the first sealing gasket;

the second end plate is removably attached to the primary housing at the second open end thereof and closes the second open end;

a second sealing gasket between the second end plate and the primary housing at the second open end thereof to seal between the second end plate and the primary housing to prevent fluid leakage between the second end plate and the primary housing, the second sealing gasket includes at least one fluid opening formed therethrough that is aligned with the fluid passages to permit fluid flow through the second sealing gasket;

the first sealing gasket has a construction that is different than the second sealing gasket;

a cooling liquid within the interior space and submerging the heat generating electronic components in direct contact therewith; and a circulation system that circulates the cooling liquid in the electronic system, the circulation system is configured to direct the cooling liquid through the fluid passages in the first wall, the circulation system includes a pump mounted in the primary housing or on the first or second plate wherein the cooling liquid is cooled without the circulation system circulating the cooling liquid to an external heat exchanger.

11. The electronic system of claim 10, wherein the first end plate includes a plurality of heat dissipating fins on an exterior surface thereof, and the second end plate includes a plurality of heat dissipating fins on an exterior surface thereof.

\* \* \* \* \*